(12) United States Patent
Ando et al.

(10) Patent No.: US 11,205,698 B2
(45) Date of Patent: Dec. 21, 2021

(54) MULTIPLE WORK FUNCTION NANOSHEET TRANSISTORS WITH INNER SPACER MODULATION

(71) Applicant: International Business Machines Corporation, Armonk, NY (US)

(72) Inventors: Takashi Ando, Eastchester, NY (US); Ruilong Xie, Niskayuna, NY (US); Alexander Reznicek, Troy, NY (US); Pouya Hashemi, Purchase, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 16/851,534

(22) Filed: Apr. 17, 2020

(65) Prior Publication Data

US 2021/0328013 A1 Oct. 21, 2021

(51) Int. Cl.
*H01L 29/06* (2006.01)
*H01L 21/02* (2006.01)
*H01L 21/306* (2006.01)
*H01L 29/66* (2006.01)
(Continued)

(52) U.S. Cl.
CPC .... *H01L 29/0673* (2013.01); *H01L 21/02532* (2013.01); *H01L 21/30604* (2013.01);
(Continued)

(58) Field of Classification Search
CPC .............. H01L 29/0673; H01L 29/785; H01L 29/1037; H01L 21/02532; H01L 29/66795; H01L 29/66553; H01L 2029/7858
See application file for complete search history.

(56) References Cited

U.S. PATENT DOCUMENTS 9,653,289 B1 5/2017 Balakrishnan et al.
9,947,804 B1 4/2018 Frougier et al.
(Continued)

FOREIGN PATENT DOCUMENTS

WO 2018063359 A1 4/2018

OTHER PUBLICATIONS

C.-H. Lin et al., "High Performance 14nm SOI FinFET CMOS Technology with 0.0174μm2 Embedded DRAM and 15 Levels of Cu Metallization," IEEE International Electron Devices Meeting (IEDM), Dec. 15-17, 2014, 3 pages.
(Continued)

*Primary Examiner* — Changhyun Yi
(74) *Attorney, Agent, or Firm* — Jeffrey S LaBaw; Ryan, Mason & Lewis, LLP

(57) ABSTRACT

A method for manufacturing a semiconductor device includes forming a plurality of first and second silicon germanium layers, and a plurality of silicon layers in a stacked configuration. The stacked configuration includes a repeating arrangement of a silicon layer stacked on an arrangement of at least one of the first and at least two of the second silicon germanium layers. The first and second silicon germanium layers are etched from exposed lateral sides, and plurality of first inner spacers are formed adjacent remaining portions of the first and second silicon germanium layers. Parts of the remaining portions of the second germanium layers are positioned between the first inner spacers and the silicon layers. The method also includes forming a plurality of second inner spacers, and removing the remaining portions of the first and second silicon germanium layers, leaving spaces between the first inner spacers and the silicon layers.

20 Claims, 8 Drawing Sheets

(51) Int. Cl.
*H01L 29/423* (2006.01)
*H01L 29/49* (2006.01)
*H01L 29/08* (2006.01)
*H01L 29/10* (2006.01)
*H01L 29/78* (2006.01)

(52) U.S. Cl.
CPC ...... *H01L 29/0847* (2013.01); *H01L 29/1037* (2013.01); *H01L 29/42392* (2013.01); *H01L 29/4966* (2013.01); *H01L 29/6653* (2013.01); *H01L 29/6656* (2013.01); *H01L 29/66553* (2013.01); *H01L 29/66795* (2013.01); *H01L 29/785* (2013.01)

(56) References Cited

U.S. PATENT DOCUMENTS

| | | | |
|---|---|---|---|
| 9,972,701 | B2 | 5/2018 | Kim et al. |
| 10,008,575 | B2 | 6/2018 | Suh et al. |
| 10,014,393 | B2 | 7/2018 | Song et al. |
| 10,163,626 | B2 | 12/2018 | Lin et al. |
| 2015/0021699 | A1 | 1/2015 | Ando et al. |
| 2018/0212067 | A1 | 7/2018 | Lee et al. |
| 2021/0083074 | A1* | 3/2021 | Yang .................... H01L 29/517 |

OTHER PUBLICATIONS

J. Lin et al., "Advanced Manufacturing Technology: Gaseous Chemical Oxide Removal," https://www.researchgate.net/publication/301348111_Advanced_Manufacturing_Technology_Gaseous_Chemical_Oxide_Removal, Conference: CSTIC, Mar. 2016.

"Applied Materials Announces Breakthrough in Interface Engineering Technology for 65-45nm Transistors," Applied Materials, Inc., Sep. 20, 2005, 2 pages.

* cited by examiner

LOW VL DEVICE

HIGH VL DEVICE

HIGH Vt DEVICE

HIGH Vt DEVICE (n-TYPE)

LOW Vt DEVICE (n-TYPE)

HIGH Vt DEVICE (p-TYPE)

LOW Vt DEVICE (p-TYPE)

MULTIPLE WORK FUNCTION NANOSHEET TRANSISTORS WITH INNER SPACER MODULATION

BACKGROUND

Nanosheet devices can be viable device options instead of fin field-effect transistors (FinFETs). For example, nanowires or nanosheets can be used as the fin structure in a dual-gate, tri-gate or gate-all-around (GAA) FET device. Complementary metal-oxide semiconductor (CMOS) scaling can be enabled by the use of stacked nanowires and nanosheets, which offer superior electrostatics and higher current density per footprint area than FinFETs.

Multiple work function gate stacks are needed for achieving CMOS technology with multiple threshold voltages on fully depleted channel architectures to take advantage of higher mobility and smaller device variability due to absence of channel doping.

Conventional multiple work function schemes require patterning steps after high-k dielectric deposition to pattern work function setting metals or dipole formation elements. For nanosheet devices, it is challenging to perform such patterning steps after high-k dielectric deposition due to limited space between sheets. For example, such patterning may result in organic planarization layer (OPL) pinch off in small gaps, which is difficult to remove.

SUMMARY

According to an exemplary embodiment of the present invention, a method for manufacturing a semiconductor device includes forming a plurality of first silicon germanium layers, a plurality of second silicon germanium layers and a plurality of silicon layers on a semiconductor substrate in a stacked configuration. The stacked configuration includes a repeating arrangement of a silicon layer stacked on an arrangement of at least one of the first silicon germanium layers and at least two of the second silicon germanium layers. In the method, the first and second silicon germanium layers are etched from exposed lateral sides to remove portions of the first and second silicon germanium layers. A plurality of first inner spacers are formed adjacent remaining portions of the first and second silicon germanium layers, and parts of the remaining portions of the second germanium layers are positioned between the first inner spacers and the silicon layers. The method also includes forming a plurality of second inner spacers adjacent the first inner spacers, and removing the remaining portions of the first and second silicon germanium layers, leaving a plurality of spaces between the first inner spacers and the silicon layers.

According to an exemplary embodiment of the present invention, a semiconductor device includes a plurality of gate structures and a plurality of channel layers disposed on a substrate in a stacked configuration. The stacked configuration includes a repeating arrangement of a channel layer disposed on a gate structure. A plurality of first inner spacers are disposed adjacent the gate structures, wherein parts of the gate structures are positioned on top and/or bottom surfaces of the first inner spacers between the first inner spacers and the channel layers. The device also includes a plurality of second inner spacers disposed adjacent the first inner spacers, and a plurality of source/drain regions disposed on the substrate on sides of the channel layers and the second inner spacers. The gate structures include a work function metal.

According to an exemplary embodiment of the present invention, a method for manufacturing a semiconductor device includes forming a plurality of first semiconductor layers, a plurality of second semiconductor layers and a plurality of channel layers on a semiconductor substrate in a stacked configuration. The stacked configuration includes a repeating arrangement of a channel layer stacked on an arrangement of at least one of the first semiconductor layers and at least two of the second semiconductor layers. In the method, the first and second semiconductor layers are etched from exposed lateral sides to remove portions of the first and second semiconductor layers, and a plurality of first inner spacers are formed adjacent remaining portions of the first and second semiconductor layers. Parts of the remaining portions of the second semiconductor layers are positioned between the first inner spacers and the channel layers. The method also includes forming a plurality of second inner spacers adjacent the first inner spacers, and removing the remaining portions of the first and second semiconductor layers, leaving a plurality of spaces between the first inner spacers and the channel layers.

These and other exemplary embodiments of the invention will be described in or become apparent from the following detailed description of exemplary embodiments, which is to be read in connection with the accompanying drawings.

BRIEF DESCRIPTION OF THE DRAWINGS

Exemplary embodiments of the present invention will be described below in more detail, with reference to the accompanying drawings, of which.

DETAILED DESCRIPTION

Figure 2:
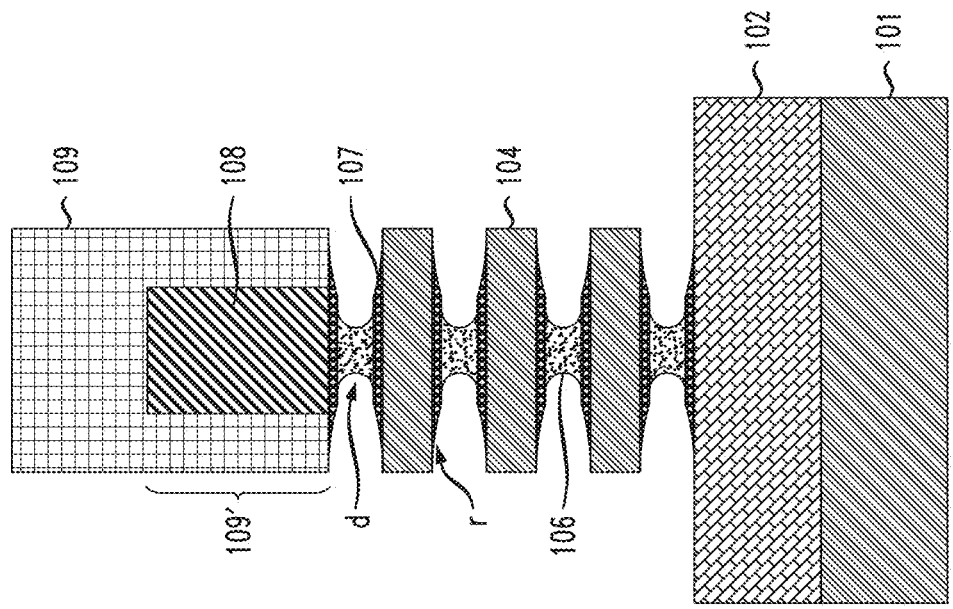
FIG. 2 is a schematic cross-sectional view illustrating manufacturing of a semiconductor device and showing lateral recessing of SiGe layers, according to an embodiment of the invention.

Exemplary embodiments of the invention will now be discussed in further detail with regard to semiconductor devices and methods of manufacturing same and, in particular, to formation of multiple work function n-type and p-type field-effect transistors (NFETs and PFETs) without metal patterning after high-k dielectric layer deposition.

It is to be understood that the various layers and/or regions shown in the accompanying drawings are not drawn to scale, and that one or more layers and/or regions of a type commonly used in, for example, CMOS, field-effect transistor (FET), nanowire FET, nanosheet FET, FinFET, metal-oxide-semiconductor field-effect transistor (MOSFET) and/or other semiconductor devices may not be explicitly shown in a given drawing. This does not imply that the layers and/or regions not explicitly shown are omitted from the actual devices. In addition, certain elements may be left out of particular views for the sake of clarity and/or simplicity when explanations are not necessarily focused on the omitted elements. Moreover, the same or similar reference numbers used throughout the drawings are used to denote the same or similar features, elements, or structures, and thus, a detailed explanation of the same or similar features, elements, or structures will not be repeated for each of the drawings.

The semiconductor devices and methods for forming same in accordance with embodiments of the present invention can be employed in applications, hardware, and/or electronic systems. Suitable hardware and systems for implementing embodiments of the invention may include, but are not limited to, personal computers, communication networks, electronic commerce systems, portable communications devices (e.g., cell and smart phones), solid-state media storage devices, functional circuitry, etc. Systems and hardware incorporating the semiconductor devices are contemplated embodiments of the invention. Given the teachings of embodiments of the invention provided herein, one of ordinary skill in the art will be able to contemplate other implementations and applications of embodiments of the invention.

The embodiments of the present invention can be used in connection with semiconductor devices that may require, for example, FETs, CMOSs, MOSFETs, nanowire FETs, nanosheet FETs and/or FinFETs. By way of non-limiting example, the semiconductor devices can include, but are not limited to FET, CMOS, MOSFET, nanowire FET, nanosheet FET and FinFET devices, and/or semiconductor devices that use FET, CMOS, MOSFET, nanowire FET, nanosheet FET and/or FinFET technology.

As used herein, "height" refers to a vertical size of an element (e.g., a layer, trench, hole, opening, etc.) in the cross-sectional views measured from a bottom surface to a top surface of the element, and/or measured with respect to a surface on which the element is located. Conversely, a "depth" refers to a vertical size of an element (e.g., a layer, trench, hole, opening, etc.) in the cross-sectional views measured from a top surface to a bottom surface of the element.

As used herein, "lateral," "lateral side," "lateral surface" refers to a side surface of an element (e.g., a layer, opening, etc.), such as a left or right side surface in the drawings.

As used herein, "width" or "length" refers to a size of an element (e.g., a layer, trench, hole, opening, etc.) in the drawings measured from a side surface to an opposite surface of the element.

As used herein, terms such as "upper", "lower", "right", "left", "vertical", "horizontal", "top", "bottom", and derivatives thereof shall relate to the disclosed structures and methods, as oriented in the drawing figures. For example, as used herein, "vertical" refers to a direction perpendicular to the top surface of the substrate in the cross-sectional views, and "horizontal" refers to a direction parallel to the top surface of the substrate in the cross-sectional views.

As used herein, unless otherwise specified, terms such as "on", "overlying", "atop", "on top", "positioned on" or "positioned atop" mean that a first element is present on a second element, wherein intervening elements may be present between the first element and the second element. As used herein, unless otherwise specified, the term "directly" used in connection with the terms "on", "overlying", "atop", "on top", "positioned on" or "positioned atop" or the term "direct contact" mean that a first element and a second element are connected without any intervening elements, such as, for example, intermediary conducting, insulating or semiconductor layers, present between the first element and the second element.

There is a need for techniques and structures to achieve multiple work function gate stacks for nanosheet devices. Embodiments of the present invention relate to methods and structures wherein two sets of inner spacers are used in nanosheet stacks to form multiple Vt devices without metal patterning due to pinch-off of deposited work function metal between spacers of a first set of inner spacers and channel layers. The pinching-off of deposited work function metal between the first set of inner spacers and channel layers permits formation of high Vt devices. For a low Vt device, the first set of inner spacers can be removed prior to metal deposition and, for a high Vt device, the first set of inner spacers remains to permit the pinching-off.

According to an embodiment, an n-type work function metal includes a titanium nitride (TiN) and an aluminum-containing alloy (e.g. TiAlC). Due to the first set of inner spacers, the aluminum-containing alloy is absent near channel edges due to the pinch off of the TiN film for high Vt devices. Due to the first set of inner spacers, a p-type work function metal includes TiN, which is pinched-off and thinner near channel edges for the high Vt devices.

Differences in Vt are achieved by variances in work function metal thickness and/or presence near channel edges between high and low Vt devices, while the work function metal thickness and/or presence at locations corresponding to the middle of the channel portions is the same for high and low Vt devices.

Although embodiments of the present invention are discussed in connection with nanosheet stacks, the embodiments of the present invention are not necessarily limited thereto, and may similarly apply to nanowire stacks.

Figure 1:
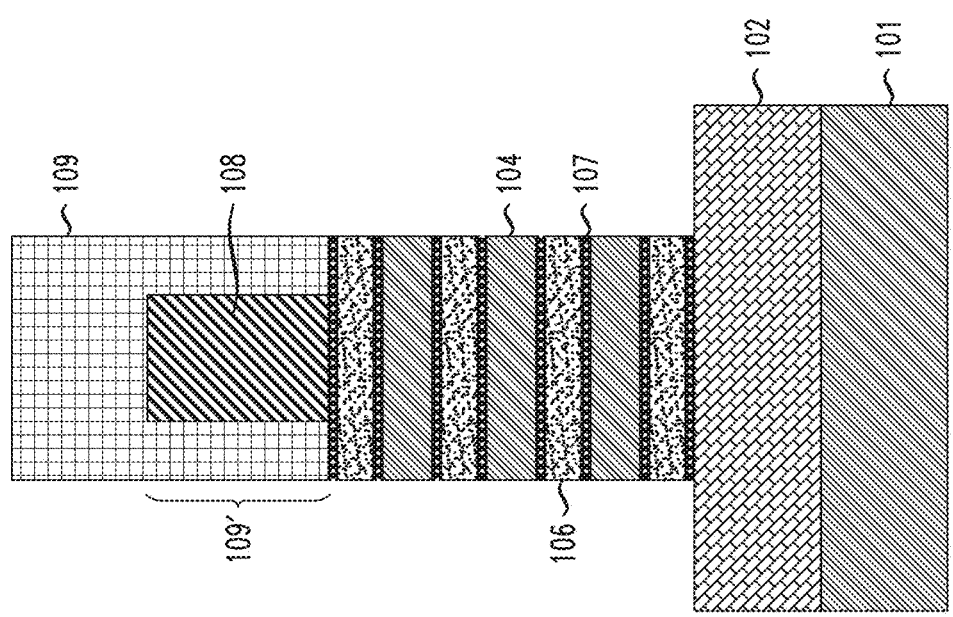
FIG. 1 is a schematic cross-sectional view illustrating manufacturing of a semiconductor device and showing formation of a stacked structure of silicon germanium (SiGe) and silicon (Si) nanosheet layers, and formation of a dummy gate and spacers on a semiconductor substrate, according to an embodiment of the invention.

FIG. 1 is a schematic cross-sectional view illustrating manufacturing of a semiconductor device and showing formation of a stacked structure of SiGe and Si nanosheet layers, and formation of dummy gates and spacers on a semiconductor substrate, according to an embodiment of the invention. As depicted in FIG. 1, a semiconductor substrate 101 comprises semiconductor material including, but not limited to, Si, SiGe, III-V, II-V compound semiconductor material or other like semiconductor material. In addition, multiple layers of the semiconductor materials can be used as the semiconductor material of the substrate. In accordance with an embodiment of the present invention, the substrate 101 comprises a bulk silicon substrate.

A dielectric isolation layer 102 is formed on the substrate 101, and comprises, for example, silicon oxide ($SiO_2$), silsesquixoanes, carbon-doped silicon oxide (SiCOH), SiLK® dielectrics, or multi-layers thereof.

SiGe layers 106 and 107 and silicon layers 104 are epitaxially grown in a stacked configuration on the substrate 101. In the stacked configuration, an SiGe layer 106 is between two SiGe layers 107, followed by a silicon layer 104 on the arrangement of SiGe layers 106 and 107. The SiGe layers 106 have a different concentration of germanium than the SiGe layers 107 on top and bottom surfaces of the SiGe layers 106. For example, in a non-limiting embodiment, in the stacked configuration, the SiGe layers 107 have a germanium concentration of 25% (SiGe25), and the SiGe layers 106 have a germanium concentration of 35% (SiGe35). The SiGe layers 106 and 107 have varying germanium concentrations so that the etch rate of the SiGe layers 106 differs from the etch rate of the SiGe layers 107. According to an embodiment, the germanium concentration of the SiGe layers 106 is in the range of about 30% to about 40%, and the germanium concentration of the SiGe layers 107 is in the range of about 20% to about 30%.

While four arrangements of SiGe layers 106 and 107 alternately stacked with three Si layers 104 are shown, the embodiments of the present invention are not necessarily limited to the shown number of layers 104, 106 and 107, and there may be more or less layers in the same alternating configuration depending on design constraints.

The terms "epitaxial growth and/or deposition" and "epitaxially formed and/or grown," mean the growth of a semiconductor material (crystalline material) on a deposition surface of another semiconductor material (crystalline material), in which the semiconductor material being grown (crystalline over layer) has substantially the same crystalline characteristics as the semiconductor material of the deposition surface (seed material). In an epitaxial deposition process, the chemical reactants provided by the source gases are controlled, and the system parameters are set so that the depositing atoms arrive at the deposition surface of the semiconductor substrate with sufficient energy to move about on the surface such that the depositing atoms orient themselves to the crystal arrangement of the atoms of the deposition surface. Therefore, an epitaxially grown semiconductor material has substantially the same crystalline characteristics as the deposition surface on which the epitaxially grown material is formed.

The epitaxial deposition process may employ the deposition chamber of a chemical vapor deposition type apparatus, such as a rapid thermal chemical vapor deposition (RTCVD), ultra-high vacuum chemical vapor deposition (UHVCVD), or a low pressure chemical vapor deposition (LPCVD) apparatus. A number of different sources may be used for the epitaxial deposition of the in situ doped semiconductor material. In some embodiments, the gas source for the deposition of an epitaxially formed semiconductor material may include silicon (Si) deposited from silane, disilane, trisilane, tetrasilane, hexachlorodisilane, tetrachlorosilane, dichlorosilane, trichlorosilane, and combinations thereof. In other examples, when the semiconductor material includes germanium, a germanium gas source may be selected from the group consisting of germane, digermane, halogermane, dichlorogermane, trichlorogermane, tetrachlorogermane and combinations thereof. The temperature for epitaxial deposition typically ranges from 450° C. to 900° C. Although higher temperature typically results in faster deposition, the faster deposition may result in crystal defects and film cracking.

In a non-limiting illustrative embodiment, SiGe layers 106 and 107, and Si channel layers 104 are formed by epitaxial growth.

In a non-limiting illustrative embodiment, a height (e.g. vertical thickness in the drawings) of the layers 104 can be in the range of about 5 nm to about 10 nm, a height (e.g. vertical thickness in the drawings) of the layers 106 can be in the range of about 4 nm to about 8 nm, and a height (e.g. vertical thickness in the drawings) of the layers 107 can be in the range of about 1 nm to about 3 nm, depending on the application of the device. The height of the layers 107 is less than the height of the layers 106. In accordance with an embodiment of the present invention, the layers 104 can include the same or a similar composition to the substrate 101. In accordance with an embodiment of the present invention, each of the layers 104 has the same or substantially the same composition and size as each other, each of the layers 106 has the same or substantially the same composition and size as each other, and each of the layers 107 has the same or substantially the same composition and size as each other.

As depicted in FIG. 1, a dummy gate material, including, but not necessarily limited to, polysilicon, amorphous silicon, or a dielectric material such as, for example, oxide or silicon nitride, is deposited on and around the stacked configuration of Si and SiGe layers 104, 106 and 107 using deposition techniques such as, for example, chemical vapor deposition (CVD), plasma enhanced CVD (PECVD), radio-frequency CVD (RFCVD), physical vapor deposition (PVD), atomic layer deposition (ALD), molecular beam deposition (MBD), pulsed laser deposition (PLD), liquid source misted chemical deposition (LSMCD), sputtering, and/or plating, followed by a planarization process, such as, chemical mechanical polishing (CMP), and lithography and etching steps to remove excess dummy gate material, and pattern the deposited layer into a dummy gate 108 corresponding to what is to become a device gate region.

Spacer and hardmask layers 109' and 109 are formed on top of and on sides of the dummy gate 108. The spacer and hardmask layers 109' and 109 are formed by one or more of the deposition techniques noted in connection with deposition of the dummy gate material. The spacer and hardmask material can comprise for example, one or more dielectrics, including, but not necessarily limited to, silicon oxide, silicon nitride (SiN), silicon oxynitride (SiON), boron nitride (BN), silicon boron nitride (SiBN), or multilayered stacks thereof. According to an example embodiment of the invention, the spacer layers 109' are deposited on sidewalls and the hardmask layer 109 on a top surface of the dummy gate 108. In accordance with an embodiment of the present invention, the spacer and hardmask materials may be the same as or different from each other.

Although not shown in FIG. 1, exposed portions of the stacked nanosheet layers 104, 106 and 107, which were not under the spacer and dummy gate layers 109' and 108, were removed using, for example, an etching process, such as reactive ion etching (RIE). As can be seen in FIG. 1, the portions of the stacked configuration of layers 104, 106 and 107 under the spacer layers 109' and under the dummy gate 108 remain after the etching process. The unoccupied areas adjacent the stacked configuration of layers 104, 106 and 107 correspond to locations where source/drain regions are to be formed (see FIG. 6).

FIG. 2 is a schematic cross-sectional view illustrating manufacturing of a semiconductor device and showing lateral recessing of SiGe layers, according to an embodiment of the invention. As shown in FIG. 2, due to the germanium in layers 106 and 107, lateral etching of the layers 106 and 107 can be performed selective to layers 104, such that the side portions of the SiGe layers 106 and 107 can be removed, while maintaining the side portions of layers 104. In addition, due to the different germanium concentration between layers 106 and 107, the SiGe layers 106, with a higher concentration of germanium than the SiGe layers 107, are etched faster than the layers 107, and therefore are etched deeper than the layers 107 as shown by arrow d. Due to the slower etching of SiGe layers 107, residual portions of the layers 107 remain as shown by arrow r. As a result, the remaining left and right sides of the SiGe layers 106 are recessed deeper to a greater lateral depth with respect to the left and right sides of the silicon layers 104 than the remaining left and right sides of the SiGe layers 107. The etching can be performed using, for example, $NH_4OH:H_2O_2$ solution.

Figure 3:
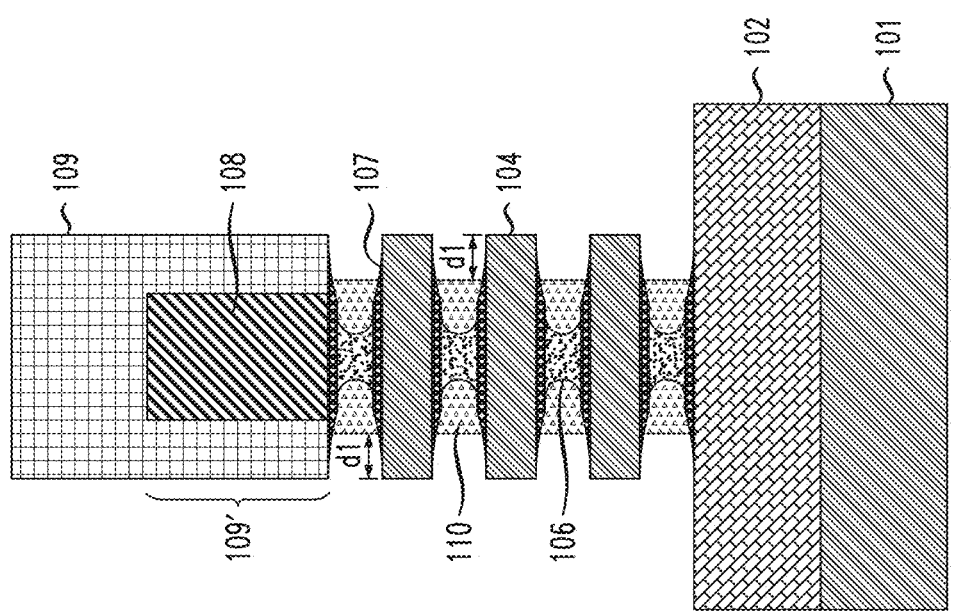
FIG. 3 is a schematic cross-sectional view illustrating manufacturing of a semiconductor device and showing formation and recessing of first inner spacers, according to an embodiment of the invention.

FIG. 3 is a schematic cross-sectional view illustrating manufacturing of a semiconductor device and showing formation and recessing of first inner spacers 110, according to an embodiment of the invention. A first inner spacer layer is deposited on top and side surfaces of the stacked configuration of Si layers 104 and remaining portions of the SiGe layers 106 and 107, as well as on exposed surfaces of the dielectric isolation layer 102 and hardmask and spacer portions 109 and 109'. In accordance with an embodiment, the first inner spacer layer can comprise, but is not necessarily limited to, a dielectric, such as silicon carbide (SiC). The vacant portions left by removal of the side portions of the layers 106 and 107 are filled in by portions of the first inner spacer layer. Deposition of the first inner spacer layer can be performed using a deposition technique including, but not necessarily limited to, ALD.

Portions of the first inner spacer layer are removed from horizontal surfaces, including from the top of the hardmask and spacer portions 109 and 109', and from horizontal portions of the dielectric isolation layer 102. In addition, portions of the first inner spacer layer on sides of the stacked configuration of layers 104, 106 and 107, and on sides of the hardmask and spacer portions 109 and 109' are also removed, leaving the portions of the first inner spacer layer in the formerly vacant portions.

As shown in FIG. 3, these remaining portions of the first inner spacer layer in the formerly vacant portions are laterally recessed on both sides with respect to the edges of the silicon layers 104 to a distance d1 to form the first inner spacers 110.

In a non-limiting illustrative example, at least one embodiment of the invention includes using a removal process, such as RIE or other isotropic etching process to perform the removal of the portions of the inner spacer layer to form the inner spacers 110. The etching process can be performed with, for example, dilute hydrofluoric acid (dHF) wet etch or a vapor phased dry etch such as chemical oxide removal (COR), or using SiCoNi® etch processing.

Figure 4:
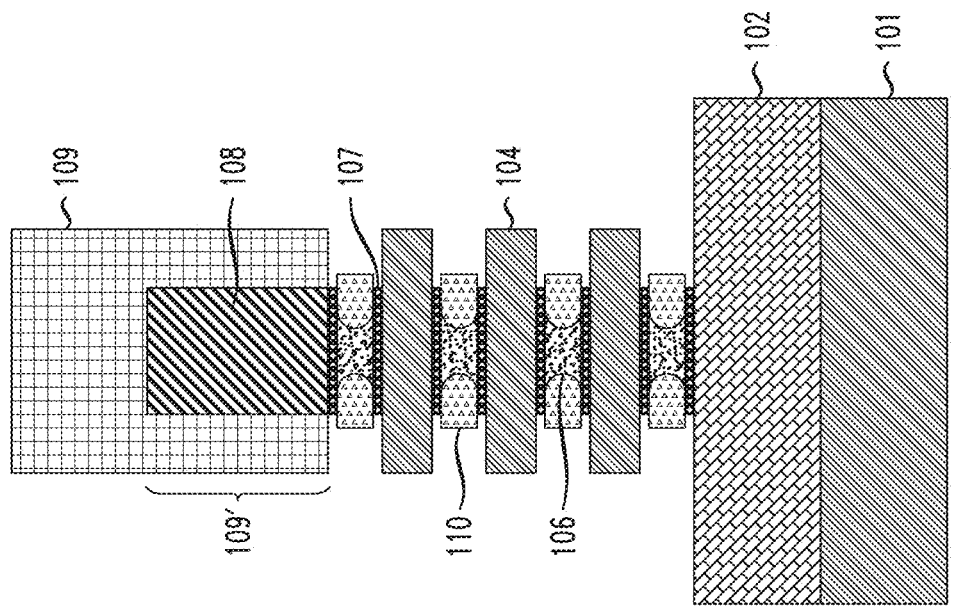
FIG. 4 is a schematic cross-sectional view illustrating manufacturing of a semiconductor device and showing removal of portions of SiGe layers not covered by the first inner spacers, according to an embodiment of the invention.

Referring to FIG. 4, with the SiGe layers 106 covered by the first inner spacers 110, the residual portions of the SiGe layers 107 are removed in an etching process using, for example, $NH_4OH:H_2O_2$ solution. As can be seen in FIG. 4, the left and right edges of the layers 107 are laterally recessed with respect to the exposed lateral sides of the first inner spacers 110. As described in more detail in connection with FIG. 7, the removal of the residual portions of the SiGe layers 107 further distances the SiGe layers 107 from where source/drain regions will be formed, so that there is no source/drain region damage during subsequent removal of SiGe layers 106 and 107.

Figure 5:
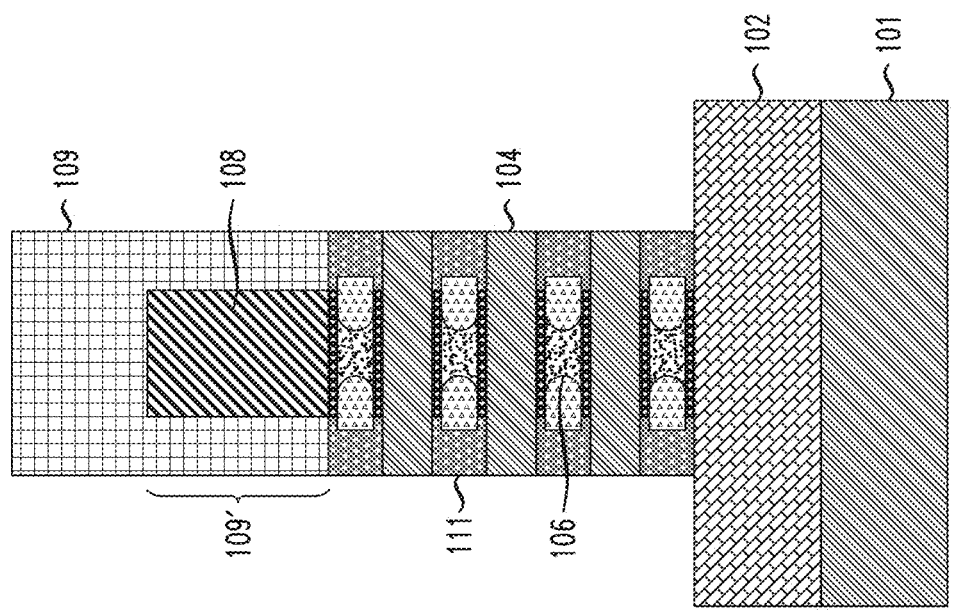
FIG. 5 is a schematic cross-sectional view illustrating manufacturing of a semiconductor device and showing formation of second inner spacers, according to an embodiment of the invention.

Referring to FIG. 5, after removal of the residual portions of the SiGe layers 106, second inner spacers 111 are formed adjacent the first inner spacers 110 in the vacant areas above and below the silicon layers 104. Similar to the processing to form the first inner spacers 110, a second inner spacer layer is deposited on top and side surfaces of the stacked configuration of Si layers 104, remaining portions of the SiGe layers 106 and 107 and first inner spacers 110, as well as on exposed surfaces of the dielectric isolation layer 102 and hardmask and spacer portions 109 and 109'. In accordance with an embodiment, the second inner spacer layer can comprise, but is not necessarily limited to, a dielectric, such as SiN, silicon boron carbon nitride (SiBCN), silicon oxycarbonitride (SIOCN), etc.

The vacant areas above and below the silicon layers 104 adjacent the first inner spacers 110 are filled in by portions of the second inner spacer layer. Deposition of the second inner spacer layer can be performed using a deposition technique including, but not necessarily limited to, ALD.

Portions of the second inner spacer layer are removed from horizontal surfaces, including from the top of the hardmask and spacer portions 109 and 109', and from horizontal portions of the dielectric isolation layer 102. In addition, portions of the first inner spacer layer on sides of the stacked configuration of layers 104, 106 and 107, and on sides of the hardmask and spacer portions 109 and 109' are also removed, leaving the second inner spacers 111 adjacent the first inner spacers 110 in the formerly vacant areas above and below the silicon layers 104. In a non-limiting illustrative example, at least one embodiment of the invention includes using a removal process, such as a gas cluster ion beam (GCIB) process.

Figure 6:
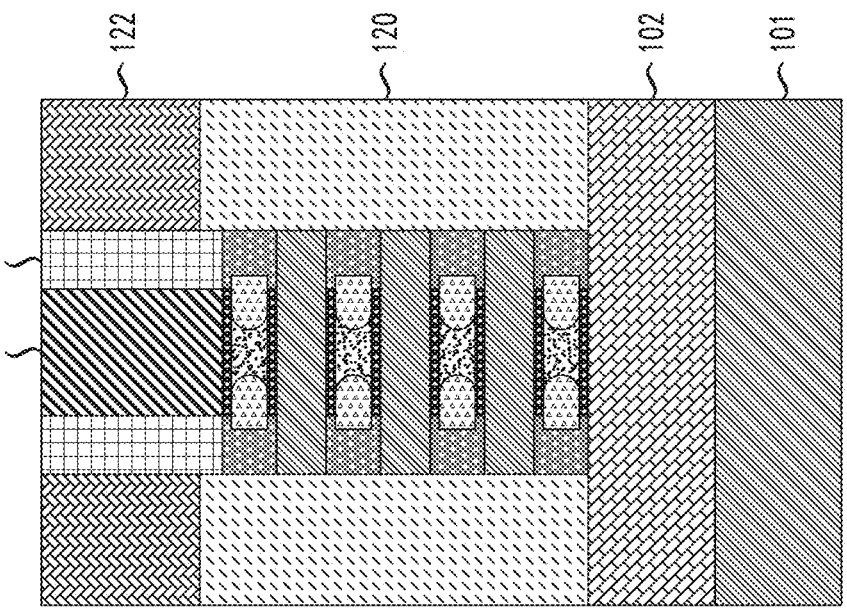
FIG. 6 is a schematic cross-sectional view illustrating manufacturing of a semiconductor device and showing epitaxial growth of source/drain regions and inter-layer dielectric (ILD) layer formation, according to an embodiment of the invention.

FIG. 6 is a schematic cross-sectional view illustrating manufacturing of a semiconductor device and showing epitaxial growth of source/drain regions and ILD layer formation, according to an embodiment of the invention. Referring to FIG. 6, epitaxial growth of source/drain regions 120 occurs from exposed sides of the silicon layers 104 of the stacked configuration. According to a non-limiting embodiment of the present invention, the conditions of the epitaxial growth process for the source/drain regions 120 are, for example, rapid thermal chemical vapor deposition (RTCVD), low-energy plasma deposition (LEPD), ultra-high vacuum chemical vapor deposition (UHVCVD), atmospheric pressure chemical vapor deposition (APCVD) or molecular beam epitaxy (MBE) epitaxial growth using $SiH_4$, $SiH_2Cl_2$, $GeH_4$, $CH_3SiH_3$, $B_2H_6$, $PF_3$, and/or $H_2$ gases with temperature and pressure ranges of about 450° C. to about 800° C., and about 5 Torr-about 300 Torr.

Side portions of the SiGe layers 106 and 107 are covered with the first and second inner spacers 110 and 111 during the epitaxial growth of the source/drain regions 120, and lateral epitaxial growth does not occur from the SiGe layers 106 and 107.

The epitaxial source/drain regions 120 become the source/drain regions for transistor devices, such as, for example, NFETs or PFETs, and can comprise in-situ phosphorous doped (ISPD) Si or Si:C for n-type devices, or in-situ boron doped (ISBD) SiGe for p-type devices, at concentrations of about $1E19/cm^3$ to about $3E21/cm^3$. By "in-situ" it is meant that the dopant that dictates the conductivity type of the doped layer is introduced during the process step, e.g., epitaxial deposition, which forms the doped layer. A height of the source/drain regions 120 adjacent the nanosheet stacks extends above a top surface of the uppermost SiGe layer 107.

An ILD layer 122, including, but not necessarily limited to, $SiO_2$, low-temperature oxide (LTO), high-temperature oxide (HTO), flowable oxide (FOX) or some other dielectric is deposited on the substrate 101 to fill in areas on and around the epitaxial source/drain regions 120 and adjacent the spacers 109'. The ILD layer 122 can be deposited using, for example, CVD, PECVD, RFCVD, PVD, ALD, MLD, MBD, PLD, LSMCD, and/or sputtering, followed by planarization by, for example, CMP to remove the hardmask 109, leaving the spacers 109' adjacent the dummy gate 108. The planarization, which removes the hardmask layer 109, exposes the top surface of the dummy gate 108.

Figure 7:
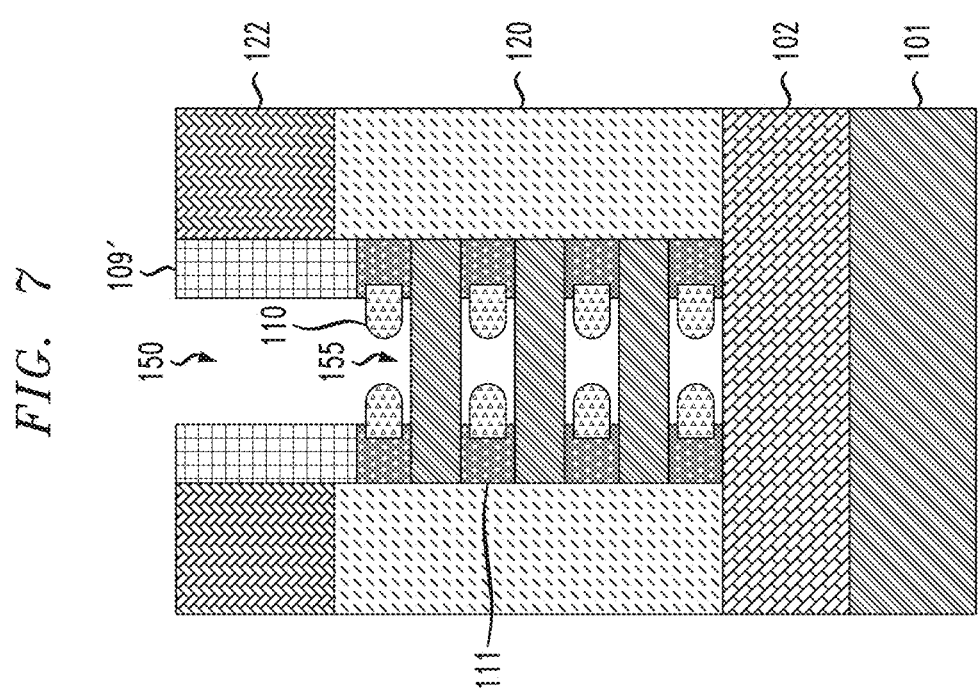
FIG. 7 is a schematic cross-sectional view illustrating manufacturing of a semiconductor device and showing dummy gate and SiGe layer removal, according to an embodiment of the invention.

FIG. 7 is a schematic cross-sectional view illustrating manufacturing of a semiconductor device and showing dummy gate and SiGe layer removal, according to an embodiment of the invention. Referring to FIG. 7, the dummy gate 108 and SiGe layers 106 and 107 are selectively removed to create respective vacant areas 150 and 155 where the dummy gate 108 and SiGe layers 106 and 107 were removed. Then, the silicon layers 104 (e.g., nanosheets or nanowires) are suspended, and in subsequent processing described in connection with FIGS. 10A, 10B, 11A and 11B, the gate structure, including, for example, gate and dielectric portions are formed in place of the dummy gate 108 and SiGe layers 106 and 107. The selective removal can be performed using wet or dry chemistries selective to Si. In non-limiting examples, $CH_3COOH:H_2O_2:HF$ or $CF_4/O_2$ based chemistries can be used. Various other etch chemistries may be used. As noted above, the previous removal of the residual portions of the SiGe layers 107, which distances the SiGe layers 107 from the source/drain regions 120, and the presence of the first and second inner spacers 110 and 111 between the source/drain regions 120 and the SiGe layers 106 and 107, prevents damage to the source/drain regions 120 during removal of SiGe layers 106 and 107.

As noted above, differences in Vt between high and low Vt devices are achieved by variances in work function metal thickness and/or presence near channel edges, while the work function metal thickness and/or presence at locations corresponding to the middle of the channel portions is the same for high and low Vt devices. The pinching-off of deposited work function metal between the first inner spacers 110 and channel layers (e.g., Si layers 104) permits reduced gate metal thickness and/or presence near channel edges of high Vt devices. For a high Vt device, the first inner spacers 110 remain to permit the pinching-off so that a thickness of work function metal is greater in areas corresponding to central portions of the plurality of channel layers than in areas corresponding to edge portions of the plurality of channel layers. For a low Vt device, the first inner spacers 110 are removed prior to metal deposition so that gate metal thickness and/or presence near channel edges is higher for low Vt devices than for high Vt devices.

According to an embodiment, the processing in FIGS. 1-7 is performed on a substrate to simultaneously form a plurality of stacked structures which are spaced apart from each other on the substrate 101. As a result, there are multiple arrangements of the structure shown in FIG. 7 on the substrate 101 which will form a plurality of devices in different locations on the substrate 101. Some of the devices will be low Vt devices, while others will be high Vt devices. In addition, some of the devices will be n-type devices, while others will be p-type devices. Starting from the structure in FIG. 7, FIGS. 8A, 8B, 9, 10A, 10B, 11A and 11B illustrate the differences in processing and resulting structures between low and high Vt devices and between n-type and p-type devices.

Figure 8B:
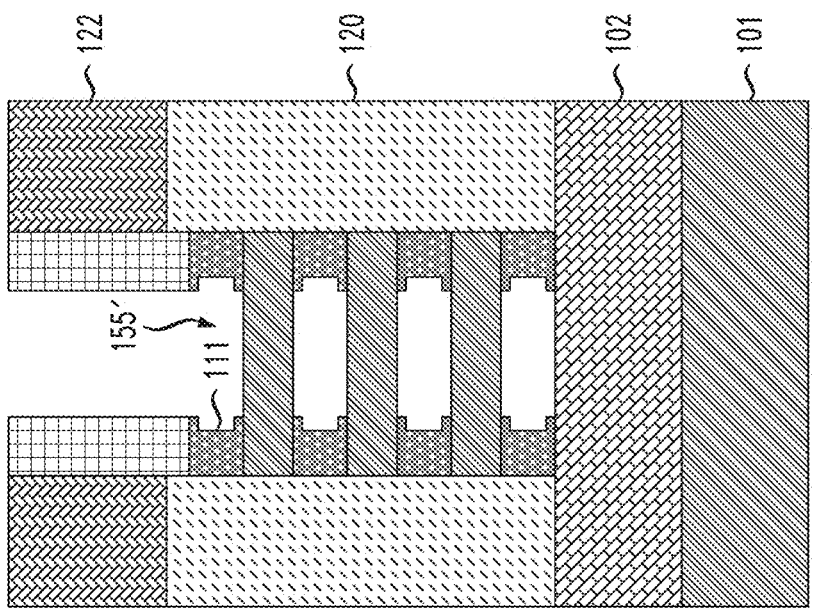
FIG. 8B is a schematic cross-sectional view illustrating manufacturing of a semiconductor device and showing first inner spacer removal for a low Vt device, according to an embodiment of the invention.
Figure 8A:
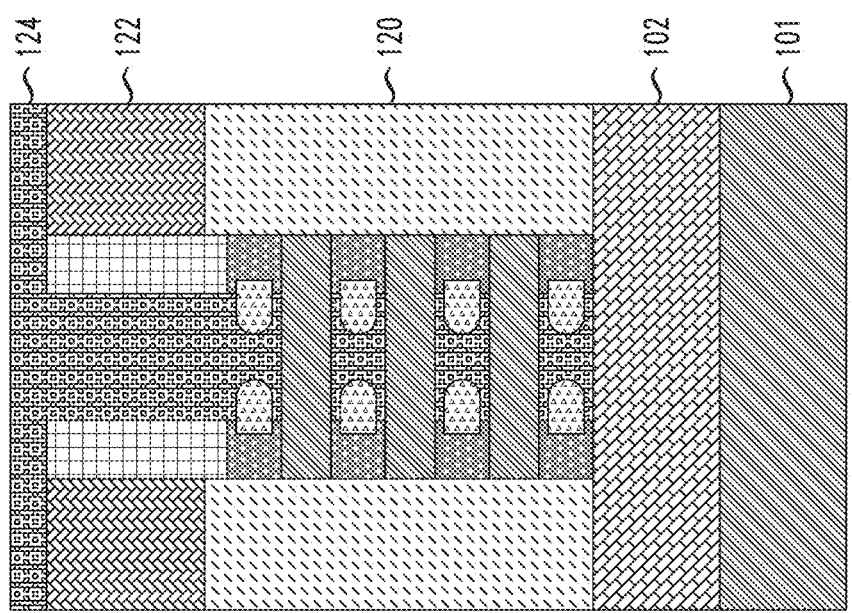
FIG. 8A is a schematic cross-sectional view illustrating manufacturing of a semiconductor device and showing masking of first inner spacers for a high threshold voltage (Vt) device, according to an embodiment of the invention.

Referring to FIG. 8A, for high Vt devices, where the first inner spacers 110 are maintained to allow for pinching-off of deposited work function metal between the first inner spacers 110 and channel layers, a mask layer 124, such as, for example, an OPL, is deposited in the vacant areas 150 and 155 to cover the first inner spacers 110. The OPL includes, but is not necessarily limited to, an organic polymer including C, H, and N. In an embodiment, the OPL material can be free of silicon (Si). According to an embodiment, the OPL material can be free of Si and fluorine (F). As defined herein, a material is free of an atomic element when the level of the atomic element in the material is at or below a trace level detectable with analytic methods available in the art. Non-limiting examples of the OPL material include JSR HM8006, JSR HM8014, AZ UM10M2, Shin Etsu ODL 102, or other similar commercially available materials from such vendors as JSR, TOK, Sumitomo, Rohm & Haas, etc. The OPL 150 can be deposited, for example, by spin coating.

Referring to FIG. 8B, for low Vt devices, a patterning process is performed to leave the first inner spacers 110 exposed, and an etching process is performed to remove the first inner spacers 110, leaving vacant areas 155' adjacent the second inner spacers 111. The patterning process can be performed by lithography and OPL open processing. The etching process to remove the first inner spacers 110 can be any suitable isotropic wet etch or dry etch.

Figure 9:
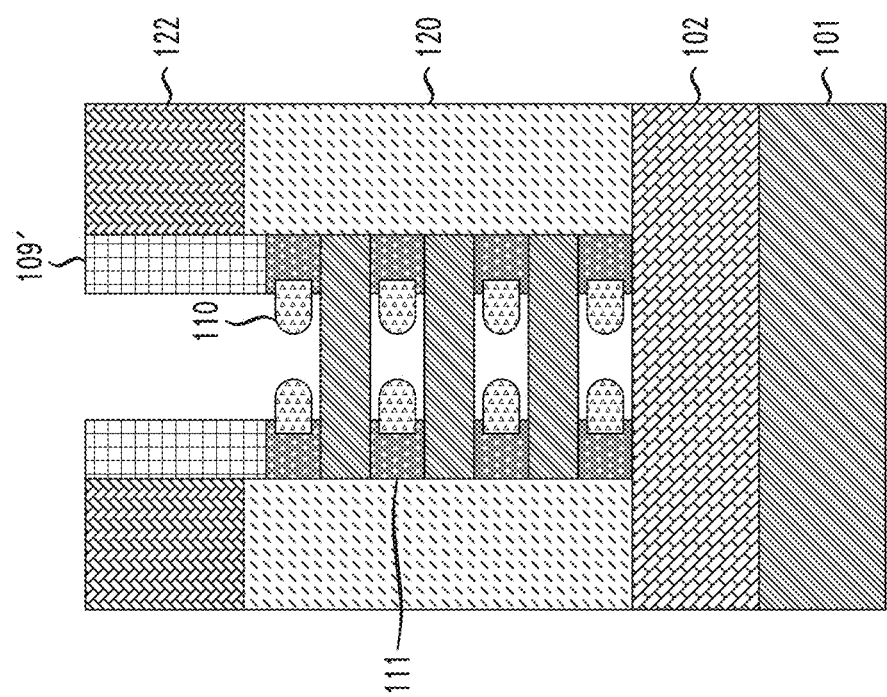
FIG. 9 is a schematic cross-sectional view illustrating manufacturing of a semiconductor device and showing removal of the mask layer for the high Vt device, according to an embodiment of the invention.

Referring to FIG. 9, following removal of the first inner spacers 110 from the low Vt devices, the mask layer 124 is removed from the high Vt devices. The mask layer 124 can be removed using, for example, an ashing process. In addition, a pre-clean process is performed on the high Vt and low Vt devices prior to gate structure formation described further herein in connection with FIGS. 10A-11B. The pre-clean process is performed with, for example, dHF, followed by the deposition process of a high-k gate dielectric.

Figure 10A:
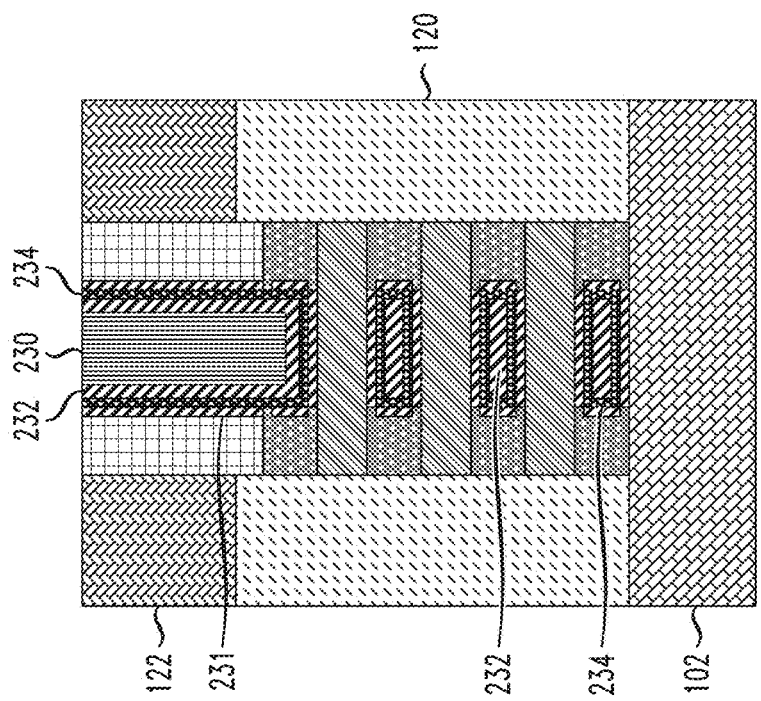
FIG. 10A is a schematic cross-sectional view illustrating manufacturing of a semiconductor device and showing high-k dielectric, work function and fill metal layer deposition for an n-type high Vt device, according to an embodiment of the invention.
Figure 10B:
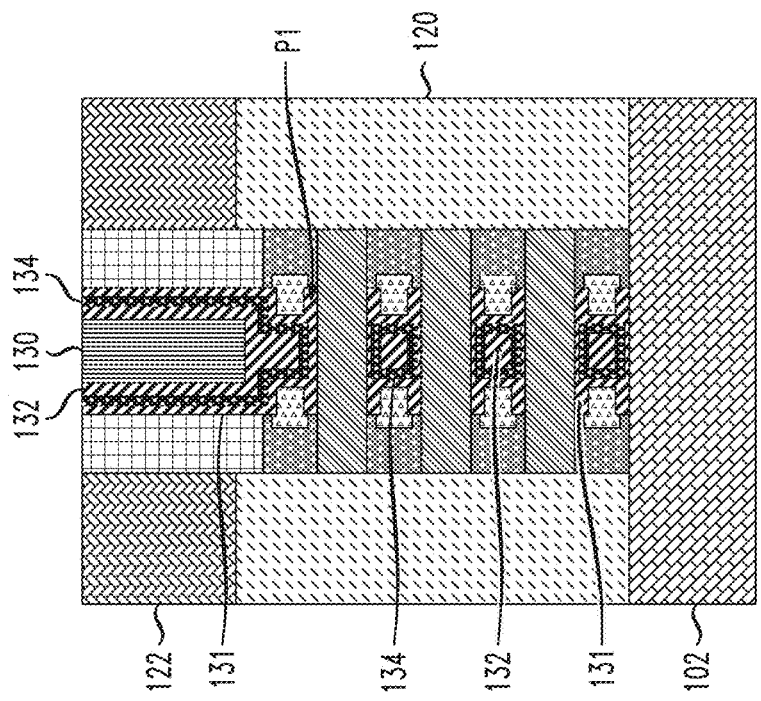
FIG. 10B is a schematic cross-sectional view illustrating manufacturing of a semiconductor device and showing high-k dielectric, work function and fill metal layer deposition for an n-type low Vt device, according to an embodiment of the invention.
Figure 11A:
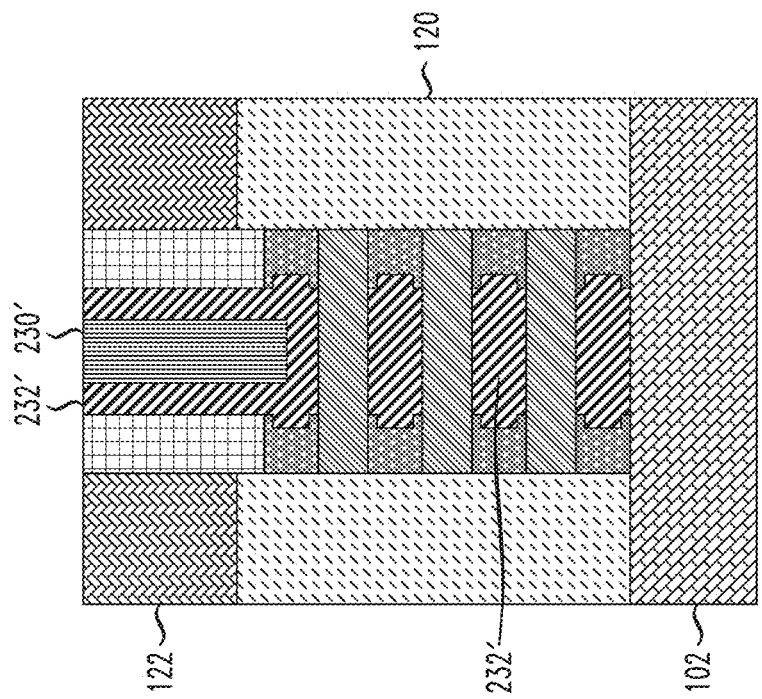
FIG. 11A is a schematic cross-sectional view illustrating manufacturing of a semiconductor device and showing high-k dielectric, work function and fill metal layer deposition for a p-type high Vt device, according to an embodiment of the invention.
Figure 11B:
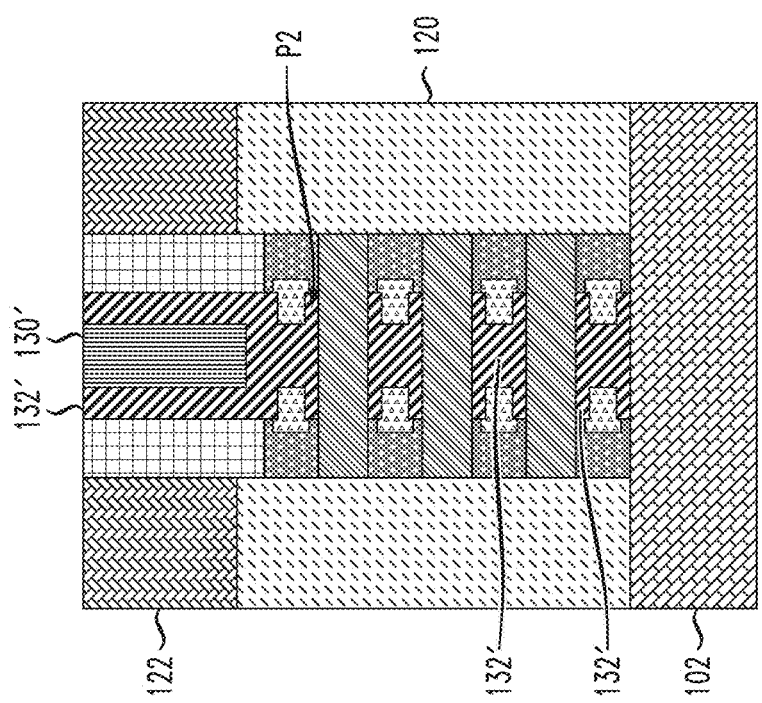
FIG. 11B is a schematic cross-sectional view illustrating manufacturing of a semiconductor device and showing high-k dielectric, work function and fill metal layer deposition for a p-type low Vt device, according to an embodiment of the invention.

Referring to FIGS. 10A-11B, different work function metals are deposited in different configurations depending on whether the device is to be a high or low Vt device, or an n or p-type device. For example, as shown in FIGS. 10A and 10B, work function metals for high and low Vt n-type devices (e.g., NFETs) include a tri-layer structure of a bottom titanium nitride (TiN) layer 131/231, an alloy layer 134/234, such as, for example, an aluminum-containing alloy (e.g., titanium aluminum carbide (TiAlC)) stacked on the bottom TiN layer 131/231, followed by a top TiN layer 132/232 stacked on the alloy layer 134/234. Referring to FIGS. 11A-11B, work function metals for high and low Vt p-type devices (e.g., PFETs) include a TiN layer 132'/232'.

As can be seen in comparisons between FIGS. 10A and 10B, and between FIGS. 11A and 11B, due to the presence or absence of the first inner spacers 110, the configuration of the work function metals differs between high and low Vt devices. As shown by the arrow P1 in FIG. 10A, in high Vt devices, where the first inner spacers 110 remain, the bottom TiN layers 131 fill in (e.g., are pinched-off in) the spaces between the channel layers (Si layers 104) and the first inner spacers 110, which establishes the thickness of the bottom TiN layers 131 between the Si layers 104 and the first inner spacers 110. The bottom TiN layer thickness is in the range between about 1 nm and about 2 nm and sufficient to fill the spaces indicated with the arrow P1 (FIG. 10A).

The bottom TiN layers 131 are conformally deposited using a conformal deposition process, such as, for example, ALD or CVD, which causes the TiN layers 131 to be deposited on opposing surfaces of the Si layers 104 and first inner spacers 110 and meet at about middle portions between the opposing surfaces to fill in the spaces between the first inner spacers 110 and the Si layers 104.

As noted herein, due to the presence of the first inner spacers 110 to cause the pinching off, the alloy layer 134 is absent near lateral channel edges (e.g., left and right in the drawings) for the high Vt devices. On the other hand, as can be seen in FIG. 10B, where the first inner spacers 110 were removed, there is no pinching off of the TiN layers 231, the alloy layer 234 is present near lateral channel edges for the low Vt devices.

As shown by the arrow P2 in FIG. 11A, in high Vt devices, where the first inner spacers 110 remain, the TiN layers 132' fill in (e.g., are pinched-off in) the spaces between the channel layers (Si layers 104) and the first inner spacers 110, which establishes the thickness of the TiN layers 132' between the Si layers 104 and the first inner spacers 110. The deposited thickness of the TiN layers 132' is greater than about 2 nm to create a thickness difference between the devices with and without the first inner spacers.

The TiN layers 132' are conformally deposited using a conformal deposition process, such as, for example, ALD or CVD, which causes the TiN layers 132' to be deposited on opposing surfaces of the Si layers 104 and first inner spacers 110 and meet at about middle portions between the opposing surfaces to fill in the spaces between the first inner spacers 110 and the Si layers 104.

As noted herein, due to the presence of the first inner spacers 110 to cause the pinching off, the amount of TiN near channel edges is less for high Vt devices than for low Vt devices. For example, as can be seen in FIG. 11B, where the first inner spacers 110 were removed, there is no pinching off of the TiN layers 232, and the amount of TiN near channel edges is more for the low Vt devices than for the high Vt devices.

Referring to FIGS. 10A-11B, in accordance with an embodiment, the gate structures are formed in vacant portions 150, 155 and 155', and each include a gate dielectric layer (not shown) such as, for example, a high-K dielectric layer including, but not necessarily limited to, $HfO_2$ (hafnium oxide), $ZrO_2$ (zirconium dioxide), hafnium zirconium oxide, $Al_2O_3$ (aluminum oxide), and $Ta_2O_5$ (tantalum V oxide) or other electronic grade (EG) oxide. Examples of high-k materials also include, but are not limited to, metal oxides such as hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate.

Following high-k dielectric layer deposition, the work function metals 131/134/132, 231/234/232, 132' or 232' as noted above are deposited. In addition to the materials TiN and TiAlC materials noted above, work function metals may also include, but are not necessarily limited to, for a PFET, tantalum nitride (TaN) or ruthenium (Ru), and for an NFET, titanium aluminum nitride (TiAlN), titanium aluminum carbon nitride (TiAlCN), tantalum aluminum carbide (TaAlC), tantalum aluminum carbon nitride (TaAlCN) or lanthanum (La) doped TiN, TaN, which can be deposited on the gate dielectric layer.

Referring to FIGS. 10A-11B, gate metal layers 130, 230, 130' or 230' include, but are not necessarily limited to, metals, such as, for example, tungsten, cobalt, zirconium, tantalum, titanium, aluminum, ruthenium, copper, metal carbides, metal nitrides, transition metal aluminides, tantalum carbide, titanium carbide, tantalum magnesium carbide, or combinations thereof deposited on the work function metal layers 132, 232, 132' or 232', respectively.

In one or more embodiments of the invention, the high-k dielectric, work function metal and gate metal layers for the gate structures can be deposited using, for example, CVD, PECVD, RFCVD, PVD, ALD, MLD, MBD, PLD, LSMCD, and/or sputtering, followed by planarization by, for example, CMP.

Although illustrative embodiments of the present invention have been described herein with reference to the accompanying drawings, it is to be understood that the invention is not limited to those precise embodiments, and that various other changes and modifications may be made by one skilled in the art without departing from the scope or spirit of the invention.

The invention claimed is:

1. A method for manufacturing a semiconductor device, comprising:

forming a plurality of first silicon germanium layers, a plurality of second silicon germanium layers and a plurality of silicon layers on a semiconductor substrate in a stacked configuration comprising a repeating arrangement of a silicon layer stacked on an arrangement of at least one of the plurality of first silicon germanium layers and at least two of the plurality of second silicon germanium layers;

etching the plurality of first and second silicon germanium layers to remove portions of the plurality of first and second silicon germanium layers from exposed lateral sides of each of the plurality of first and second silicon germanium layers;

forming a plurality of first inner spacers adjacent remaining portions of the plurality of first and second silicon germanium layers, wherein parts of the remaining portions of the plurality of second germanium layers are positioned between the plurality of first inner spacers and the plurality of silicon layers;

forming a plurality of second inner spacers adjacent the plurality of first inner spacers; and removing the remaining portions of the plurality of first and second silicon germanium layers, leaving a plurality of spaces between the plurality of first inner spacers and the plurality of silicon layers.

2. The method according to claim 1, further comprising depositing a work function metal in areas where the remaining portions of the plurality of first and second silicon germanium layers were removed, wherein the work function metal fills in the plurality of spaces.

3. The method according to claim 2, further comprising depositing an additional work function metal on the work function metal, wherein the work function metal in the plurality of spaces prevents the additional work function metal from being formed in the plurality of spaces.

4. The method according to claim 3, wherein the additional work function metal comprises an aluminum alloy.

5. The method according to claim 1, further comprising:
removing the plurality of first inner spacers; and
depositing a work function metal in areas where the remaining portions of the plurality of first and second silicon germanium layers and the plurality of first inner spacers were removed.

6. The method according to claim 1, wherein the arrangement of the at least one of the plurality of first silicon germanium layers and the at least two of the plurality of second silicon germanium layers comprises one of the plurality of first silicon germanium layers between two of the plurality of second silicon germanium layers.

7. The method according to claim 6, wherein the etching of the plurality of first and second silicon germanium layers comprises etching the plurality of first silicon germanium layers to a greater lateral depth than the plurality of second silicon germanium layers.

8. The method according to claim 7, wherein the plurality of first silicon germanium layers have a higher concentration of germanium than a germanium concentration of the plurality of second silicon germanium layers.

9. The method according to claim 8, wherein the plurality of first silicon germanium layers are etched at a faster rate than an etch rate of the plurality of second silicon germanium layers.

10. The method according to claim 6, wherein a height of each of the plurality of second silicon germanium layers is less than a height of each of the plurality of first silicon germanium layers.

11. The method according to claim 1, wherein the plurality of first inner spacers comprise a different material from the plurality of second inner spacers.

12. The method according to claim 1, further comprising removing ends of the remaining portions of the plurality of second silicon germanium layers extending beyond lateral sides of the plurality of first inner spacers.

13. The method according to claim 12, wherein the removing of the ends is performed prior to forming the plurality of second inner spacers.

14. A semiconductor device, comprising:
a plurality of gate structures and a plurality of channel layers disposed on a substrate in a stacked configuration comprising a repeating arrangement of a channel layer disposed on a gate structure;
a plurality of first inner spacers disposed adjacent the gate structures, wherein parts of the plurality of gate structures are positioned on at least one of top and bottom surfaces of the plurality of first inner spacers between the plurality of first inner spacers and the plurality of channel layers;
a plurality of second inner spacers disposed adjacent the plurality of first inner spacers; and
a plurality of source/drain regions disposed on the substrate on sides of the plurality of channel layers and the plurality of second inner spacers;
wherein the plurality of gate structures comprise a work function metal; and
wherein the parts of the plurality of gate structures positioned on at least one of the top and bottom surfaces of the plurality of first inner spacers between the plurality of first inner spacers and the plurality of channel layers comprise the work function metal.

15. The semiconductor device according to claim 14, wherein the plurality of first inner spacers comprise a different material from the plurality of second inner spacers.

16. The semiconductor device according to claim 14, wherein:
other parts of the plurality of gate structures comprise an additional work function metal disposed on the work function metal; and
the parts of the plurality of gate structures positioned on at least one of the top and bottom surfaces of the plurality of first inner spacers between the plurality of first inner spacers and the plurality of channel layers comprise the work function metal without the additional work function metal.

17. The semiconductor device according to claim 16, wherein the additional work function metal comprises an aluminum alloy.

18. A semiconductor device, comprising:
a plurality of gate structures and a plurality of channel layers disposed on a substrate in a stacked configuration comprising a repeating arrangement of a channel layer disposed on a gate structure;
a plurality of first inner spacers disposed adjacent the gate structures, wherein parts of the plurality of gate structures are positioned on at least one of top and bottom surfaces of the plurality of first inner spacers between the plurality of first inner spacers and the plurality of channel layers;
a plurality of second inner spacers disposed adjacent the plurality of first inner spacers; and
a plurality of source/drain regions disposed on the substrate on sides of the plurality of channel layers and the plurality of second inner spacers;
wherein the plurality of gate structures comprise a work function metal; and
wherein a thickness of each the plurality of gate structures is greater in areas corresponding to central portions of the plurality of channel layers than in areas corresponding to edge portions of the plurality of channel layers.

19. A method for manufacturing a semiconductor device, comprising:
forming a plurality of first semiconductor layers, a plurality of second semiconductor layers and a plurality of channel layers on a semiconductor substrate in a stacked configuration comprising a repeating arrangement of a channel layer stacked on an arrangement of at least one of the plurality of first semiconductor layers and at least two of the plurality of second semiconductor layers;
etching the plurality of first and second semiconductor layers to remove portions of the plurality of first and second semiconductor layers from exposed lateral sides of each of the plurality of first and second semiconductor layers;
forming a plurality of first inner spacers adjacent remaining portions of the plurality of first and second semiconductor layers, wherein parts of the remaining portions of the plurality of second semiconductor layers are positioned between the plurality of first inner spacers and the plurality of channel layers;

forming a plurality of second inner spacers adjacent the plurality of first inner spacers; and removing the remaining portions of the plurality of first and second semiconductor layers leaving a plurality of spaces between the plurality of first inner spacers and the plurality of channel layers.

20. The method according to claim 19, further comprising depositing a work function metal in areas where the remaining portions of the plurality of first and second semiconductor layers were removed, wherein the work function metal fills in the plurality of spaces.

* * * * *